(12) United States Patent
Perner (10) Patent No.: US 6,882,584 B2
(45) Date of Patent: Apr. 19, 2005

(54) METHOD FOR OPERATING A SEMICONDUCTOR MEMORY, AND SEMICONDUCTOR MEMORY

(75) Inventor: Martin Perner, München (DE)

(73) Assignee: Infineon Technologies AG, Munich (DE)

( * ) Notice: Subject to any disclaimer, the term of this patent is extended or adjusted under 35 U.S.C. 154(b) by 296 days.

(21) Appl. No.: 10/317,972

(22) Filed: Dec. 12, 2002

(65) Prior Publication Data

US 2003/0107942 A1 Jun. 12, 2003

(30) Foreign Application Priority Data

Dec. 12, 2001 (DE) .......................................... 101 61 042

(51) Int. Cl.$^7$ ................................................ G11C 7/00
(52) U.S. Cl. .............. 365/200; 365/230.03; 365/230.06
(58) Field of Search ........................... 365/200, 230.03, 365/230.06

(56) References Cited

U.S. PATENT DOCUMENTS

| | | | |
|---|---|---|---|
| 3,311,890 A | * | 3/1967 | Waaben ..................... 714/719 |
| 4,715,034 A | | 12/1987 | Jacobson |
| 4,903,266 A | | 2/1990 | Hack |
| 4,959,832 A | | 9/1990 | Bardell, Jr. |
| 5,301,199 A | | 4/1994 | Ikenaga et al. |
| 5,428,561 A | | 6/1995 | Bryant et al. |
| 5,748,551 A | | 5/1998 | Ryan et al. |
| 6,049,502 A | | 4/2000 | Cowles et al. |
| 6,061,290 A | | 5/2000 | Shirley |
| 6,278,648 B1 | | 8/2001 | Cowles et al. |
| 6,351,681 B1 | * | 2/2002 | Chih et al. .................. 700/121 |
| 6,356,485 B1 | * | 3/2002 | Proebsting ............. 365/189.01 |

FOREIGN PATENT DOCUMENTS

| | | |
|---|---|---|
| DE | 44 41 007 C2 | 5/1995 |
| DE | 199 16 065 A1 | 10/2000 |

* cited by examiner

*Primary Examiner*—Gene N. Auduong
(74) *Attorney, Agent, or Firm*—Laurence A. Greenberg; Werner H. Stemer; Ralph E. Locher

(57) ABSTRACT

A semiconductor memory and a method for operating the semiconductor memory store information items at least in triplicate at memory addresses in a plurality of memory areas, preferably memory banks, and read the information items therefrom. A checking unit contains synchronization circuits compares the data values that are read and, if the information items that are read differ, can ascertain and possibly immediately correct storage errors. The method of operating the memory enables quasi-random access to memory cells using a permutation circuit. In a test mode for the semiconductor memory, an error log circuit can output error log data instead of or in addition to data values that are read.

29 Claims, 7 Drawing Sheets

FIG 1

Permutation Circuit

Error Log Circuit

FIG 2

Synchronization Circuit

Correction Circuit

FIG 4A $i = 1, 2$
$j = 1, 2, 3, 4$ $F_W = G_{11}, G_{21}, G_{12}, G_{22},$
$\quad\quad G_{13}, G_{23}, G_{14}, G_{24},$
$F_R = G_{11}, G_{12}, G_{13}, G_{14},$
$\quad\quad G_{21}, G_{22}, G_{23}, G_{24},$ $S_W = 1 1 0 0 1 0 1 1$
$S_R = 1 0 1 1 1 0 0 1$

FIG 4B

| $W_x = 0\,0\,0\,1$ | $W_y = 0\,0\,1\,0$ |
|---|---|
| $i\ = 0\,1\,0\,1$ | $j\ = 1\,1\,0\,1$ |
| $W_x = 0\,0\,0\,1$ | $W_y = 0\,0\,1\,0$ |
| XOR ↓↓↓↓ | XOR ↓↓↓↓ |
| $i' = 0\,1\,0\,0$ | $j' = 1\,1\,1\,1$ |

| Bank | DQij |
|---|---|
| 1 | 0 1 0 1 0 1 1 1 0 |
| 2 | 0 1 1 1 0 1 1 1 0 |
| 3 | 0 1 0 1 0 1 1 1 0 |
| 4 | 0 1 0 1 0 0 1 1 0 |
| DQ | 0 1 0 1 0 1 1 1 0 }S |
| D | 0 0 1 0 0 1 0 0 0 }F |

F → [ FZE ] → "2"

Error Counting Device

FIG 7B

```
        DQ1'    DQ2'    DQ3'    DQ4'
         ↓       ↓       ↓       ↓ t1  : [PF,     SCF,    DQ0,    DQ1]
t2  : [PF,     DQ2,    DQ3,    XXX]
t3  : [PF,     x00,    x01,    x02]
t4  : [PF,     x03,    x04,    x05]
t5  : [PF,     x06,    x07,    x08]
t6  : [PF,     x09,    x10,    x11]
t7  : [PF,     x12,    x13,    x14]
t8  : [PF,     y00,    y01,    y02]
t9  : [PF,     y03,    y04,    y05]
t10 : [PF,     y06,    y07,    y08]
t11 : [PF,     y09,    y10,    y11]
t12 : [PF,     y12,    y13,    y14]
```

METHOD FOR OPERATING A SEMICONDUCTOR MEMORY, AND SEMICONDUCTOR MEMORY

BACKGROUND OF THE INVENTION

Field of the Invention

The invention relates to a method for operating a semiconductor memory having a plurality of memory areas, in which information items are written to memory addresses and are read from the memory addresses again, and in which an error check on the information items is performed.

The invention also relates to a semiconductor memory having a plurality of memory areas that each have a multiplicity of memory addresses to which information items can be written and from which information items can be read.

In integrated semiconductor memories, a large number of memory cells store information items in the form of quantities of charge. The stored information items have to remain stored over a long time in the case of nonvolatile semiconductor memories, and in the case of volatile semiconductor memories they need to remain stored at least for the period of time up to the next refresh operation. Tolerances for fabricating integrated semiconductor circuits and not completely avoidable leakage currents can result in such charges flowing away. Improved manufacturing technologies can eliminate such influence.

External influences, particularly alpha radiation, affect the reliability of the information storage. Alpha particles penetrating an integrated semiconductor memory produce secondary charges that flow away in an uncontrolled manner and can thus alter quantities of charge stored in memory cells. Since the penetration of alpha radiation cannot be avoided, manufacturers of semiconductor products specify error tolerances that stipulate an upper limit for the likelihood of an error when storing information items. Particularly in safety-related circuits, the probability of failure must be only a few storage errors per million memory cells.

In view of the errors that cannot be ruled out completely when operating an integrated semiconductor memory, complex ECC (Error Code Correction) modules are used in which time-consuming error corrections are made. By way of example, checksums are formed that can be used to identify erroneous data bits. The modules include a plurality of semiconductor chips that are disposed on a printed circuit board, for example. These are used at intervals of time to perform reconditioning operations on the memory information items, "memory scrubbings", in order to eliminate an accumulation of errors in individual memory cells before errors occur in adjacent or associated memory cells which can no longer be corrected. The technical involvement, the cost and the time involved for such external corrective measures in the semiconductor memory are very high.

SUMMARY OF THE INVENTION

It is accordingly an object of the invention to provide a method for operating a semiconductor memory, and a semiconductor memory that overcome the hereinafore-mentioned disadvantages of the heretofore-known devices of this general type and that achieve reliable storage without external measures. In addition, the aim is to increase the reliability of storage above the degree obtained to date.

With the foregoing and other objects in view, there is provided, in accordance with the invention, a method in which the memory addresses from at least three memory areas are connected in parallel with one another such that each write or read operation accesses a group of memory addresses that includes a respective memory address from each memory area. In that, writing routes the same information item to all the memory addresses in a group. In addition, the error check is performed such that it checks whether the information items at the memory addresses in a group are identical to one another.

According to the invention, multiple storage is used, which involves the data to be stored being stored a plurality of times, specifically at least in triplicate. Since the invention results in each data bit being stored in three different memory cells that are in different memory areas and are at a physical distance apart, a storage error in more than one of these memory cells at the same time is unlikely. Therefore, it is possible to assume that two memory cells reproduce the stored data bit correctly. When reading a data bit, all three memory cells to which this data bit was routed are accessed. An error check is performed which, unlike conventional ECC corrections, requires no additional data in order to check the correctness of the information items read. Instead, a check is performed to determine if the information items read from the at least three memory cells concur with one another. If the same value for the data bit is read from all three memory cells, a storage error can be ruled out with a degree of probability bordering on certainty. Only if one of the memory cells to which the same data bit was routed outputs a different data bit than the rest of the memory cells is there a storage error or reading error.

The inventive method has the advantage that the error check can be performed on the semiconductor memory and by the semiconductor memory itself. The reason is that no additional information items such as checksums are needed in order to check the correctness of the stored data. A mere comparison of information items stored on the semiconductor memory a plurality of times allows the correct data value to be ascertained; the comparison can be made in a small subcircuit on the semiconductor switch. This eliminates the complex measures that were necessary to date in order to operate a semiconductor memory partly without error. The inventive comparison of the data stored a plurality of times is made on the chip.

The semiconductor memory operated in accordance with the invention has a smaller storage capacity than when it stores each information item only once. Instead, however, the reliability of storage is higher than for single storage, which is checked using complex ECC corrections.

Preferred embodiments provide for the memory areas to be memory banks and for memory addresses from precisely four memory banks to be connected in parallel with one another. These embodiments utilize the architectures of commercially available semiconductor memories whose memory cell arrays are divided into banks. Each memory bank is the same size, i.e. has the same number of memory cells. A condition is that no fewer than three memory banks be provided. Semiconductor memories having two memory banks need to be divided into smaller memory areas than the memory banks in order to be able to be operated in the inventive manner. Redundancy in memory banks does not adversely affect the inventive method.

In one preferred embodiment, if the error check reveals that information items at the memory addresses in a group are not identical to one another, a correction is made that involves that data value with which most information items at the memory addresses in the group concur being written to all the memory addresses in this group. While the invention provides reliable evidence of the correctness of stored information items, this embodiment provides for this evidence to be used to correct any storage errors on the semiconductor memory. This is done by virtue of all the memory addresses in a group of memory addresses being read, and the information items read being replaced with a data bit which corresponds to the data value which is read from most of these memory addresses. This data bit is then written back to all the memory addresses in this group, which overwrites any storage error. This restores the at least triplicate storage of each information item.

A fundamental advantage of the correction of errors described herein is that it can be effected instantaneously, i.e. immediately after access to memory cells. No forwarding to a circuit outside the semiconductor chip or to another semiconductor chip is necessary. In particular, error correction can be performed automatically upon a read operation.

Another development of the invention provides for this error correction to be performed automatically when the stored information items are refreshed as well.

In one development of the invention, the semiconductor memory is operated in a test mode, where information items are repeatedly written to various groups of memory addresses and read from them, the order in which various groups of memory addresses are successively accessed when information items are read being a different one than when information items are written. The present invention opens up new opportunities for testing a semiconductor memory that arise from the type of error correction performed. The internal comparison of the data values read from the memory cells to which an information item has been written a plurality of times can be taken as a basis for ascertaining the correctness of the information item from said data values themselves. No additional information items such as checksums are necessary. In particular, there is no need to record what value was originally written to the memory cells. In every conventional method for testing a semiconductor memory, the data bit routed to the semiconductor memory for storage needs to be compared with that data bit which has been read from the semiconductor memory in order to establish a storage error. The comparison could be made possible by virtue of the sequence of information items and addressed memory cells being detected outside the semiconductor memory and later being compared with the result of reading. Such additional storage is preferably avoided by entering the information items needing to be stored in the memory cells in a methodical order and reading them again in the same methodical order. The order in which various cells are addressed is organized such that it is identical when writing to the cells and when reading from the cells. Otherwise, a direct comparison of original and reproduced information is not valid. The necessary concurrence between the orders of writing and reading means that the test options for testing a semiconductor memory are very limited. Thus, the time elapsing between storage and reading is always the same, irrespective of the memory cell addressed. This means that random storage errors are discovered only in part.

The inventive method also can be used to execute a memory test using different orders for reading and writing, however. It is no longer necessary to associate the two orders with one another, since the correctness of the data bits read [lacuna] from themselves, i.e. from the bit value read in majority for the triplicate storage. This means that the cells are accessed in a different order when reading than when writing.

In one development of this test method, the order for various groups of memory addresses that are accessed in succession is stipulated by virtue of a prescribed order for all the groups of memory addresses being permutated. A major problem when attempting to detect random storage errors is that of addressing all the cells in the semiconductor memory with sufficient probability. Random access methods allow this to be done only with an unusual involvement of time and cost. However, a few memory cells remain that have not yet been addressed. To ensure that every single memory cell is addressed, the embodiment described herein provides for any desired systematic or else quasi-random order of memory addresses to be prescribed first. This sequence contains every single group of memory cells just once. This order for memory address groups is then permutated, i.e. the order of the groups is interchanged. The advantage of this is that it is possible to generate any randomly produced order that ensures that every group of memory cells is addressed with the same frequency. Over a relatively long test period, a plurality of such permutations can be formed, which can also differ from one another. Overall, every group of memory cells is addressed precisely n times in this context. Storage errors are discovered with a high level of reliability.

Preferably, a different permutation is chosen when reading information items than when writing information items.

Preferably, permutation of the order for the groups of memory addresses involves the row addresses and the column addresses being permutated independently of one another. In this case, the architecture of commercially available memories is utilized in order to address word line addresses and bit line addresses through separate address lines or successively through the same address lines. The individual permutations of the bit lines among one another and of the word lines among one another mean that the type of data transport is not adversely affected by the permutation formation entailed by abruptly changing addressing for memory cells that are a long distance apart.

Preferably, the order for groups of memory addresses that are accessed in succession is permutated by virtue of each memory address being logically combined, digit by digit, with a permutation constant, having as many binary digits as the area-internal memory addresses in a memory area, in binary notation by using an arithmetic operation to give a digit sequence that indicates the permutated memory address. The arithmetic operation logically combines two bit values to give the logic value one at the precise point at which the bit values are different from one another. This logic XOR function logically combines two different bits to give a one and two identical bits to give a zero. This operation always requires two bits. A bit corresponding to a memory address is either retained or inverted, depending on the value assumed by that digit of the permutation constant which is combined with the memory address. Memory addresses include a relatively long sequence of digits in binary notation. Using a permutation constant that, in binary notation, includes as many digits as a memory address within a memory area, an XOR function can be produced digit by digit. This results in a second digit sequence that can be associated with a new memory address. The XOR function ensures that, for a sequence of first memory addresses in which every single memory address appears just once only, a sequence of second memory addresses is formed which likewise contains every memory address just once. This is the very way in which a permutation is formed. Hence, a randomly produced second order of changed memory addresses can be generated on a methodical, systematic first order of memory addresses.

The information items that are to be stored and read again are preferably altered using permutation constants that are used to permutate groups of memory addresses among one another when writing or reading. The permutation constants for either the write or read operation serve simultaneously to produce quasi-random bit sequences that are written and read again.

Preferably, the order in which various groups of memory addresses are accessed in succession is permutated by a circuit on the semiconductor memory. This method is advantageous over external quasi-random memory addressing operations because it can be performed on the semiconductor memory itself, for example by a small subcircuit at high speed, and without relatively long data links. The subcircuit for permuting the memory addresses and possibly the data values can be a circuit including gates that perform the necessary digit-by-digit XOR functions.

In addition, data values needing to be stored likewise can be altered using appropriate permutations and permutation constants. To this end, dedicated circuits can be provided on the semiconductor memory.

In one development of the inventive method, the semiconductor memory is operated in a test mode in which reading information items involves an error log created on the basis of the error check being output instead of the information items that are read. In this context, output lines usually intended for transmitting the data values read from the memory cells are used for outputting test information items referring to these data values. It is possible to set an operating mode in which knowledge of the values stored in the memory cells is of no importance, which means that transmission of these data is not necessary. Instead, the data lines, normally referred to as DQ (Data Query), can be used for information items which are more meaningful in another respect. Thus, by way of example, error rates or the type of errors occurring can be transmitted instead of the memory cell contents that are read.

In one preferred embodiment, reading the information items from a group of memory cells involves a data value being output that indicates if the information items that are read are identical to one another. Such a data value, which can be zero as standard while there is no error and jumps to the value one by way of exception in the event of a discrepancy, is of particular importance for evidence of random error rates. It can be output and transmitted just as quickly as the read data value itself, but no longer subsequently needs to be assessed itself. Since it likewise uses only one bit itself, it can be transmitted via a DQ (Data Query) line.

In particular, just the data value with no indication of the memory addresses is output and is used for error counting. This allows errors in the entire semiconductor memory to be counted. Error counting can be performed using an error counting device disposed on the semiconductor memory or using an external error counting device.

Preferably, information items in a plurality of groups of memory addresses are accessed simultaneously by a data bus having a plurality of data lines, and each data line in the data bus outputs the data value from that group of memory addresses that it is accessing. In this context, simultaneous access to a plurality of information items that have each been stored at least three times is possible.

In another preferred embodiment, an error log is created in which, whenever information items have been read, the data lines successively output, in a plurality of time cycles, details about the occurrence of errors, the type of errors that have occurred, the numbers of the data lines that output an error, and the memory addresses that have been read from.

Using such an extended error log intended for more detailed test evaluations, it is possible to transmit all significant test information items, for example the changed memory addresses accessed which were calculated using the address permutations effected on the semiconductor memory, over a plurality of time cycles after each group of memory addresses has been read.

With the objects of the invention in view, there is also provided a semiconductor memory having a plurality of memory areas which each have a multiplicity of memory addresses to which information items can be written and from which information items can be read, the semiconductor memory having synchronization circuits. The synchronization circuits can connect memory addresses from at least three memory areas in parallel with one another such that each write or read operation accesses a group of memory addresses that includes a respective memory address from each memory area. For writing, the synchronization circuits route the same information item to all the memory addresses in a group. In addition, the semiconductor memory has a checking unit that can be used to check whether the information items at the memory addresses in a group are identical to one another.

The synchronization circuits prompt each information item to be written not (as conventionally) just to one memory address in a single semiconductor memory, but rather, inline with the invention, to a respective memory address in at least three memory areas. This storage in at least three different memory cells, which normally have the same memory-area-internal address but belong to different memory areas, allows reliable storage. This writing and reading in parallel memory areas and the checking unit that performs an identity check on those data bits in a group's memory cells which are identified upon reading, preferably also upon refreshing of information items, mean that the semiconductor memory operates without error with a degree of probability bordering on certainty.

In one preferred embodiment, the synchronization circuits are integrated in the checking unit. Because each synchronization circuit combines at least three memory addresses to form an address group, an output signal from the synchronization circuits can be used directly as the test result.

Preferably, each synchronization circuit is connected to a memory address from each memory area. In this case, the memory areas are preferably memory banks. In particular, precisely four memory banks are provided.

In one development of the invention, each synchronization circuit has a correction circuit that, following reading and/or upon refreshing of information items, routes a standard data value to all the memory addresses connected to the synchronization circuit. The correction circuit can be used to overwrite an identified error, which converts the knowledge of erroneous data bits immediately into a correction. This correction does not need to be made solely when reading; it can be performed automatically during every refresh operation for refreshing memory contents. Such a "self-purging semiconductor memory" is particularly resistant to error.

In another development, a plurality of operating modes for the semiconductor memory can be set in which, alternatively, the synchronization circuits and the correction circuits or just the synchronization circuits are activated or the synchronization circuits and the correction circuits are deactivated. The operating mode of the semiconductor memory then can be changed over by appropriate code numbers, which can be entered via external connections on the semiconductor memory, for example, between a high-security mode with error correction, a high-security mode in which errors occurring are merely displayed, and a normal mode of operation. The operating mode can also be changed temporarily for test purposes.

Preferably, the semiconductor memory has a circuit that is used to interchange memory addresses within the memory and to redirect commands to the interchanged memory addresses. This circuit permutes the memory addresses accessed by write and read commands among one another and redirects these commands as a result. Such a memory-internal permutation circuit integrated on the semiconductor memory is used to extend the test options in a semiconductor memory that conventionally can be tested only using external test units having very restricted options. Such test units, which attempt to produce quasi-random topological test patterns, have only a restricted stock of topological test patterns. Using a permutation circuit integrated on the semiconductor memory, any randomly produced address sequences can be generated from such methodical orders of memory addresses.

In line with another development, the semiconductor memory has a circuit for outputting an error log, which circuit outputs data values indicating whether the information items read in a group of memory addresses are identical to one another, instead of or in addition to information items read from the memory addresses. This development is aimed at operating modes in which the stored information items themselves are not important, but rather only the type and number of storage errors are of interest. Particularly during a test mode, error log data, in the simplest case a data bit indicating whether or not a storage error has occurred in a group of memory cells, can be output instead of the stored information items.

Finally, in another development, a plurality of operating modes for the semiconductor memory can be set in which, alternatively, just the information items read from the individual memory addresses in the same group or, instead of these information items, just data values indicating whether these information items are identical to one another, or these data values and additionally the information items which are read, are output. Various operating modes then also can be set for the type of error log wanted. In the simplest case, the test log contains only data bits that respectively indicate an error and that need to be counted only internally and/or externally in order to assess the susceptibility to error. Despite the error precaution taken through triplicate storage, such tests may be necessary in order to check the adherence to the prescribed production tolerances and to eliminate any defective semiconductor memories immediately after the semiconductor memory has been fabricated.

Other features that are considered as characteristic for the invention are set forth in the appended claims.

Although the invention is illustrated and described herein as embodied in a method for operating a semiconductor memory, and a semiconductor memory, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
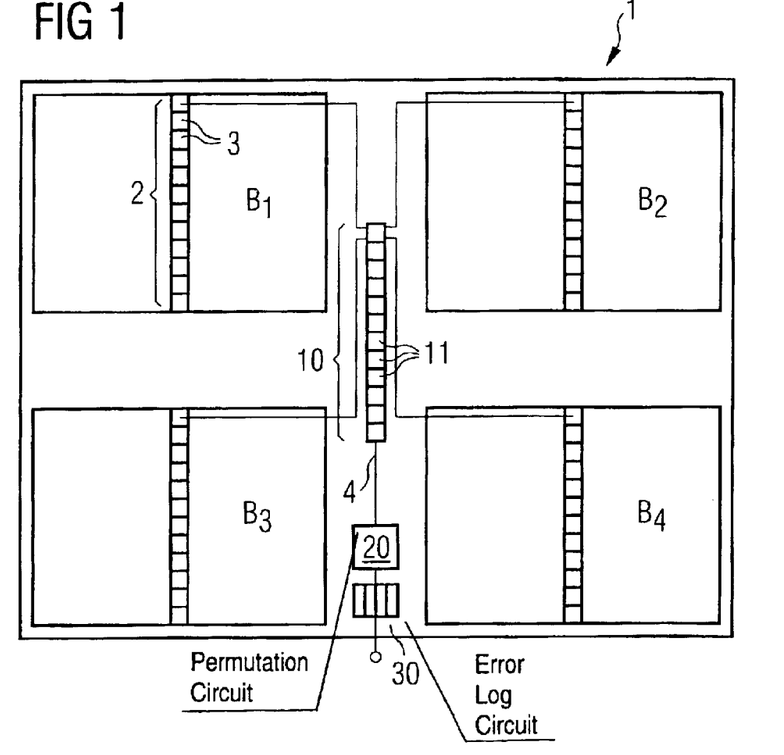
FIG. 1 is a diagrammatic plan view showing a semiconductor memory according to the invention.

Referring now to the figures of the drawings in detail and first, particularly to FIG. 1 thereof, there is shown a semiconductor memory 1 that has four memory banks B1, B2, B3 and B4. The semiconductor memory can be a volatile semiconductor memory, for example a DRAM (Dynamic Random Access Memory), or a nonvolatile memory. In each memory bank the semiconductor memory 1 has memory addresses (not shown in more detail) that are connected, as in the conventional manner, to word lines and bit lines running at right angles to one another on the substrate. According to the number of the word line and of the bit line, a memory cell is identified by the memory address Aij. By way of example, i can indicate the associated word line and j can indicate the associated bit line, or vice versa. The total number of word lines or bit lines provided per memory bank is identical for each memory bank.

A memory address is accessed by first opening a word line and then reading a bit line. In FIG. 1, the center of each memory bank B1, B2, B3, B4 shows vertically running rows 2 of signal amplifiers 3 that are respectively provided for reading a bit line. In accordance with the invention, a central region of the semiconductor memory, the "belt", is provided with a configuration 10 of synchronization circuits 11, each of which is connected to four respective signal amplifiers 3, one of which is situated in each of the memory areas B1, B2, B3, B4. Using the synchronization circuits 11, the data values read from four memory addresses configured in different memory banks can be synchronized, i.e. compared with one another and combined to give a single data value that can either be output by the output line 4 shown and by further circuits yet to be described at a later point, the permutation circuit 20 and the error log circuit 30, or can be written back to the four connected memory addresses.

Figure 2:
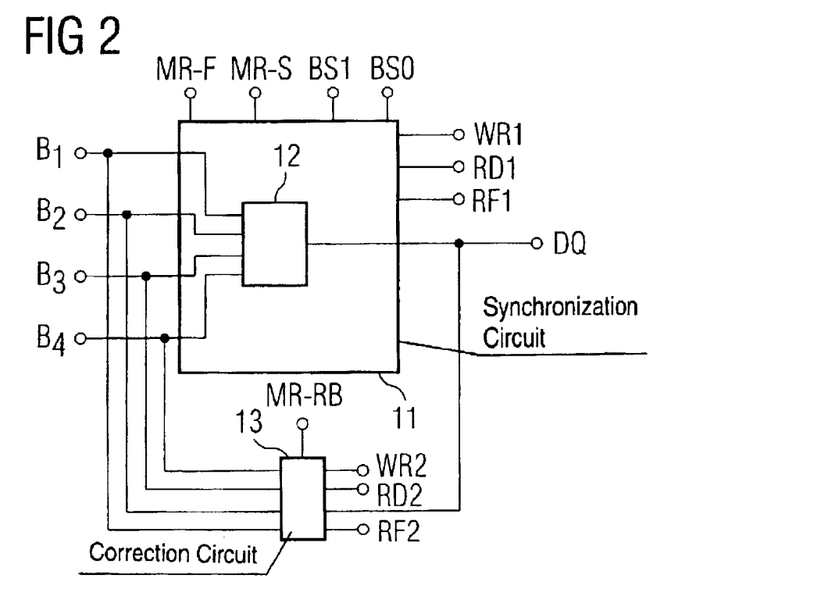
FIG. 2 is a block diagram of a synchronization circuit in the semiconductor memory from FIG. 1.

FIG. 2 shows, schematically, a synchronization circuit 11 which is connected to bit lines in the memory banks B1, B2, B3, B4. These lines can be used to read or to write data, for which purpose the synchronization circuit 11 has a further data line DQ on the right-hand side. The synchronization circuit 11 converts four information items Aij1, Aij2, Aij3, and Aij4 read from the memory banks into a single data bit which can be forwarded via the data line DQ as information item Aij. Conversely, a single data bit Aij can be routed to four memory addresses from a total of four memory banks using the synchronization circuit 11. Preferably, a correction circuit 13 is provided which, if different data values are read from the four memory areas, generates a standard value, writes it back and thus corrects storage errors. The option of writing back data values can be activated or deactivated using an appropriate mode register MR-WB (write back).

The synchronization unit 11 can be activated and deactivated, for which purpose a mode register MR-S (synchronization) is provided. Further connections BS1 and BS0, which can be used to route a respective data bit for selecting a memory bank, can be turned off using the mode register switch MR-S. The circuit depicted in FIG. 2 also can be used to output an error log, for which purpose the mode of operation of the semiconductor memory can be changed over by a mode register switch MR-F (error log) to output an error log. Supply lines WR1, WR2 for writing, RD1 and RD2 for reading and RF1 and RF2 for refreshing memory contents are used to supply the synchronization circuit 11 with the respective command that is to be executed.

Figure 3A:
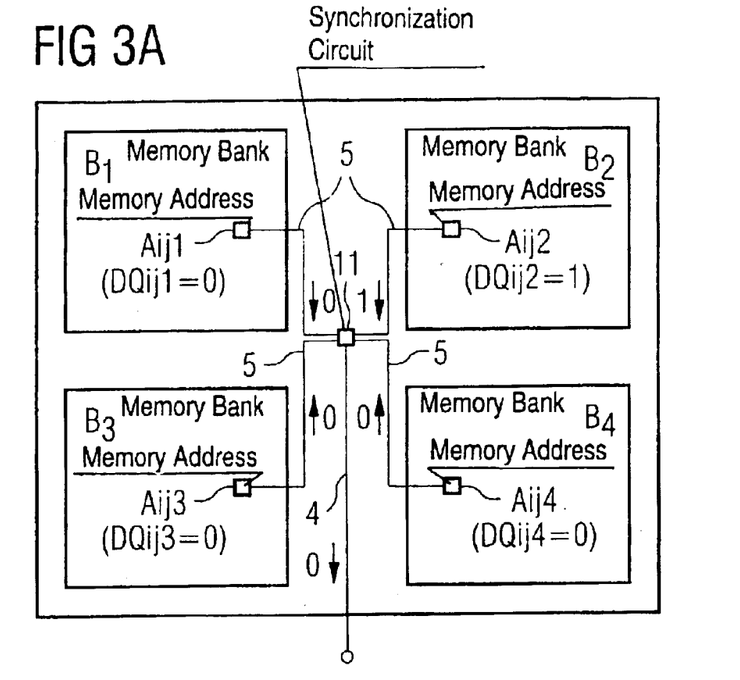
FIGS. 3A and 3B are block diagrams showing modes of operation for the semiconductor memory from FIG. 1.

FIG. 3A shows the mode of operation of a synchronization circuit 11 when reading memory contents. FIG. 3A shows memory addresses Aij1, Aij2, Aij3 and Aij4 configured on the respective word and bit lines in the memory banks B1, B2, B3, B4. Each of these four memory addresses is connected to the synchronization circuit 11 by a supply line 5.

In the mode of operation shown in FIG. 3A, data bits are read from the memory addresses in each memory bank by the synchronization unit. The data bits are "1" in the case of the memory bank B2 and are each "0" in the case of the rest of the memory banks. In the memory bank B2, a storage error has occurred, which means that this memory bank's data bit is different from the others. The synchronization circuit 11 uses a logic gate to calculate from the four bits that have been read a single bit value corresponding to that which has been read from most of the memory addresses Aij1, Aij2, Aij3 and Aij4. In the bit situation shown in FIG. 3A, the bit value "0" is output via the output line 4.

Figure 3B:
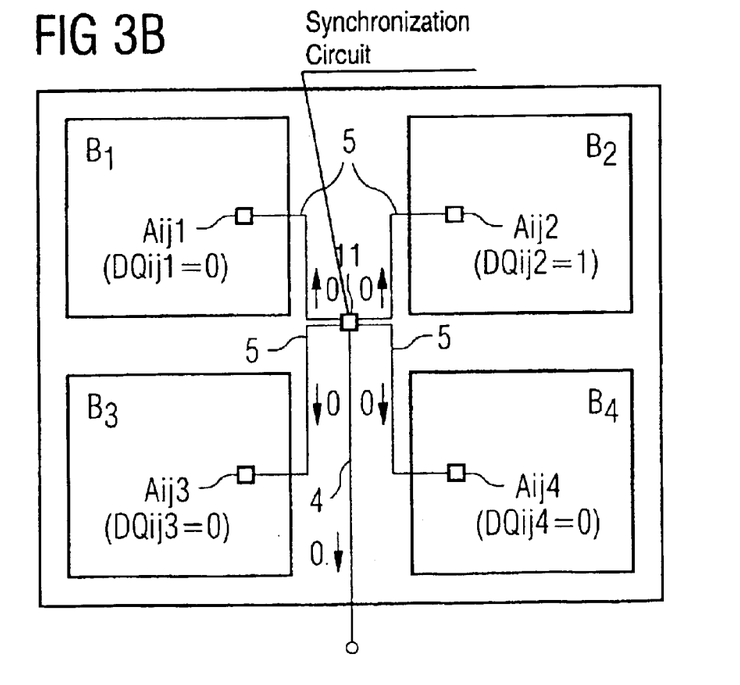

FIG. 3B shows another way in which the synchronization circuit 11 works when the correction circuit 12 has been turned on. In this case, the same bit values as in FIG. 3A were read by the synchronization circuit 11. This time, however, the ascertained correct bit value "0" that should have been stored in all four memory banks B1, B2, B3, and B4 is both forwarded by an output line 4 and written to the four connected memory addresses again by the supply lines 5. In this way, the bit value "1" which is incorrect in the memory bank B2 is corrected to "0".

Figure 4A:
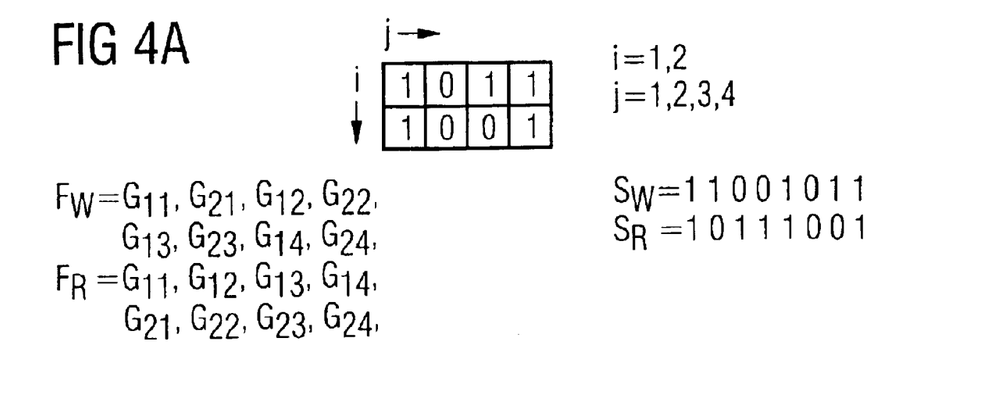
FIGS. 4A to 4C are tables showing methods for permuting memory addresses.

FIG. 4A schematically shows a configuration of eight memory addresses which are numbered in the x and y directions by numerical indices i and j. The address of each memory cell is clearly defined by pairs of numbers (ij). FIG. 4A shows the stored information items shown in each memory cell in the form of data bits "0" or "1".

When a semiconductor memory is being tested, bit sequences are written to it arbitrarily and are read from it. To identify as many different types of error as possible, attempts are made to access different memory cells in the semiconductor memory in as random an addressing order as possible, to write "0" or "1" to the memory cells arbitrarily and to read these information items again. The test-mode operation of a semiconductor memory always works such that a sequence of data bits is written on an address basis and is read again after a time. In this context, in the simplest case, the same addressing order is observed for reading as for storage, so that the entire volume of data does not need to be stored outside the semiconductor memory which is to be tested, and the bit sequences written and read do not need to be associated with one another. If the data topology is generated on an address basis and is taken into account for reading, the memory cells can be accessed using a different address order. If, however, data topologies that are independent of address are generated, then read access and write access need to be effected using the same address order. Only adherence to the same order for writing and for reading provides the assurance that the information items currently being read can be compared with the information items stored shortly beforehand and storage errors can be diagnosed in the event of differences.

If, by contrast, the memory cells are accessed for writing in a different addressing order than for reading, the data sequences written and read can no longer be associated with one another if no address-based data topology is used. The bit sequence $S_W$ written in FIG. 4A was written successively to the consecutive memory cells according to the address sequence $F_W$ with an initially constant address value j for initially increasing address values i. Only when the maximum value for the number i was reached was the number j increased by one (1). In this way, the bit values shown in the eight memory cells were produced. Upon reading, the memory cells were read according to the address sequence $F_R$ with fixed i for initially increasing j. With this order, the bit sequence $S_R$ was read, which does not concur with the bit sequence $S_W$. Although the bit sequence corresponds to the correct bit values in the eight memory cells, the bit sequence $S_R$ which has been read out cannot be associated with the bit sequence $S_W$ which has been read in. Although all the information items have been read correctly, no evidence of error rates can be provided, since the two bit sequences do not concur. For this reason, every conventional test mode in a semiconductor memory involves write access and read access to the memory addresses in the same order.

By contrast, the inventive method makes it possible to identify errors when operating the semiconductor memory regardless of the addressing order in which the memory addresses are accessed or of the address-based data topology, i.e. the physical distribution of stored information items in the semiconductor memory. The reason is that each information item is stored at least in triplicate in mutually corresponding memory cells (which are configured at respectively identical memory-internal addresses in different memory banks). Each information item is thus stored a plurality of times. When simultaneously reading these information items and during the error check to determine whether or not these information items concur, it is possible to establish which information value has been stored and output by most of the memory addresses Aij1, Aij2, Aij3 and Aij4 connected to a synchronization unit 11. In line with FIG. 3A, these four connected memory addresses forming the group Gij of memory cells which is addressed by the synchronization circuit 11 deliver the bit value "0" three times and the bit value "1" once. These bit values are converted into the bit value "0", which is assigned to the group Gij of memory cells. Because it is highly unlikely that more than one of the four memory cells addressed will store or output an incorrect bit value, the bit value "0" which is output by the synchronization circuit 11 always reproduces the correct stored value in practice.

With reference to FIG. 4A, this means that the bit sequence $S_R$ that is read includes data bits in which every bit has already been tested for correctness. A clear association between this bit sequence and the written bit sequence $S_W$ is therefore not necessary. It is therefore possible, regardless of the addressing order and of the address-based data topology in which the memory addresses were accessed for writing, for information items to be read in an entirely different order, and they therefore allow reliable diagnosis of storage errors.

Figure 4B:
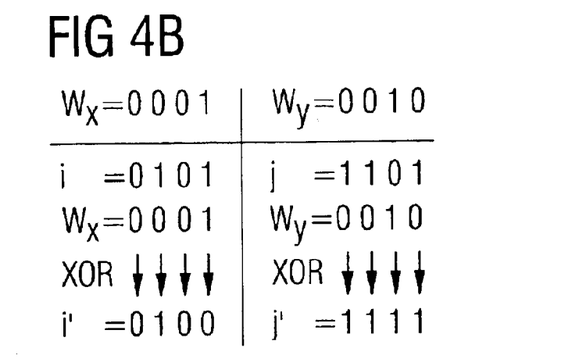

FIG. 4B shows an arithmetic example of permutation of memory addresses using a permutation constant. The example is based on a memory-bank-internal memory address that has four places in binary notation for columns X and rows Y. Accordingly, the permutation constant is likewise split into a constant $W_X=0001$ for the permutation of rows and $W_Y=0010$ for the permutation of columns. In the arithmetic example, column addresses and row addresses are permutated separately from one another. For a memory cell with the row address i=0101, the changed row address is calculated by virtue of the row address i and the row permutation constant $W_X$ being logically combined digit by digit by an XOR function to give the new row address i'. The XOR function for two binary digits produces "1" at the precise point at which the binary digits are not equal and produces the value "1" in the second digit of the changed row address i' and the value "0" in the rest of the digits. In the manner outlined, all the row and column addresses are converted into new corresponding addresses, i.e. are interchanged. As a result, by way of example, the memory-internal address (i, j)=01011101 becomes the changed address (i', j')=01001111. Using the interchanging of memory addresses described here, a methodical sequence of memory addresses which involves each memory address being addressed precisely once can be used to produce a quasi-random access order. The permutated access order affords the advantage of random distribution and also, on the other hand, of very much more reliable test results, since the underlying methodical order means that, even after the permutation, each memory cell is addressed with the same frequency, irrespective of the duration of the memory test.

Figure 4C:
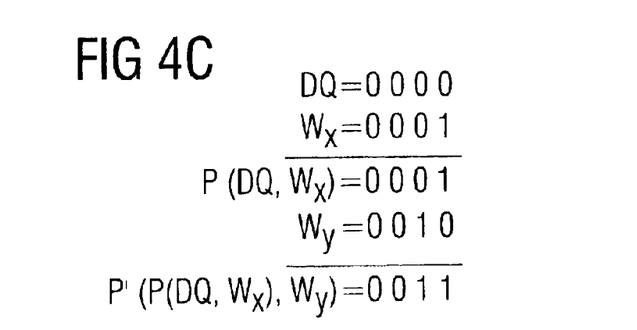

FIG. 4C shows another preferred embodiment in which even the data themselves that are written to the memory addresses are altered quasi-randomly using an arithmetic operation similar to permutation. In this case, the same permutation constants $W_X$ and $W_Y$ are used. It is even sufficient for the initial value prescribed to be the same stored value 0000 for all the data. According to the type of digit-by-digit logic combination using the XOR function, this stored value is initially converted, using the row permutation constant, into a first changed data value P, which is then in turn converted using the column permutation constant into another changed data value P'. The original data value 0000 thus becomes a binary number that is dependent on the position of the memory address in the memory area. This allows memory processes to be in an even more variable form.

Figure 5A:
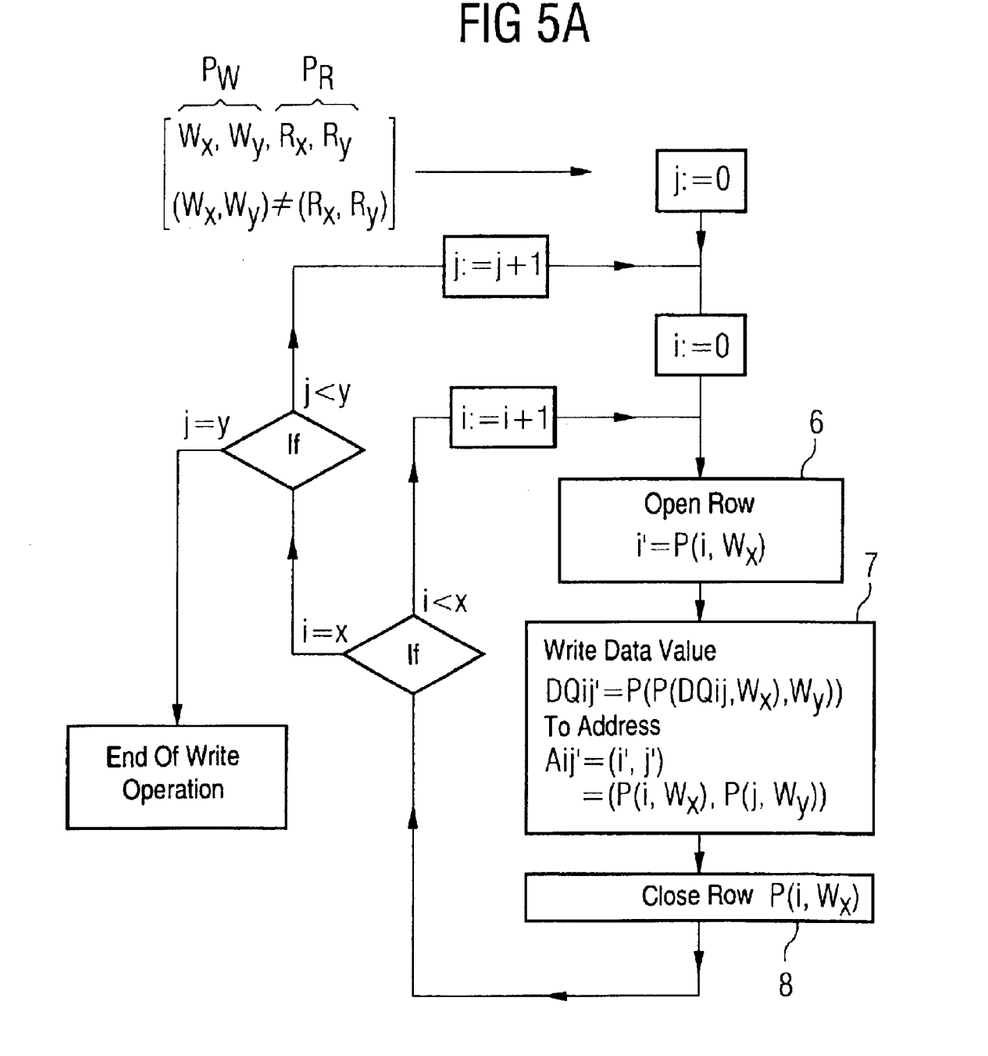
FIGS. 5A and 5B are flowcharts illustrating memory address permutations.
Figure 5B:
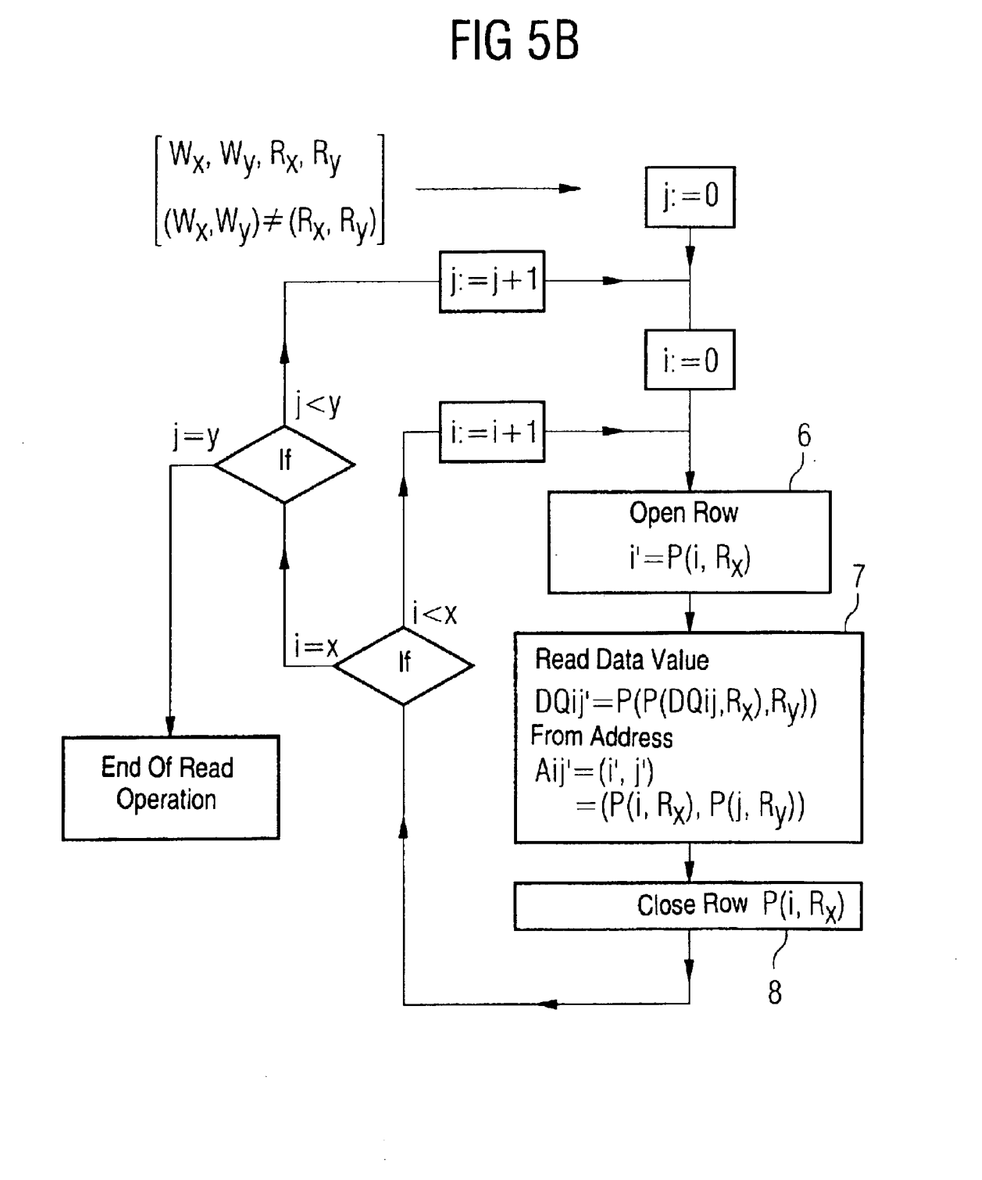

FIGS. 5A and 5B show flowcharts illustrating test methods for writing to and reading from a semiconductor memory in accordance with the invention. These test methods involve the permutations and data value changes described in FIGS. 4B and 4C being effected. This simulates random access to a semiconductor memory. At the start, permutation constants $W_X$, $W_Y$ for writing information items are defined and permutation constants $R_X$, $R_Y$ for reading, which are different from the former, are defined. The different writing and reading permutation constants result in the memory addresses being accessed in different orders for writing and reading. Such access operations can be appropriately evaluated only using the inventive method, which is no longer limited to the conventionally identical access orders on account of the multiple storage.

Any desired systematic access scheme can be used for random access to the memory addresses. By way of example, in FIG. 5A, the address variables j and i are increased in sequence from "0" to their respective maximum values Y and X, with i initially being increased for fixed j in FIG. 5A. For a prescribed memory address, the permutated row value i' is first calculated in a step 6. The row with this row address is subsequently opened. In a step 7, the changed column address j' is then also calculated which, together with the row address, identifies the memory address Aij' at which an information item needs to be stored instead of the originally prescribed memory address Aij. The information item itself is calculated based on the method described in FIG. 4C, which produces the data bit DQij'. This data bit is written to the address Aij'. Finally, the row i' is closed again in a step 8. This means that the first data bit is stored. These steps are then repeated cyclically until the original row variable i has attained its maximum value. The column variable j is then also respectively increased. Writing to the semiconductor memory can be terminated when, as shown in FIG. 5, each cell has been addressed once. Write operations repeatedly produced by permutations can take place, however, particularly with new permutation constants which differ from the old ones preferably by a primary number of greater than 2. This ensures that the repeated pass does not just confirm the information items already written.

When information items have been written to the semiconductor memory in line with FIG. 5A, the memory addresses can be read in line with the method shown in FIG. 5B. The reading method works like the method shown in FIG. 5A, but effects read access to the memory addresses in a different order than when writing, which is expressed by different permutation constants $R_x$, $R_y$. In this case, too, after each pass of the complete cell array, the permutation constants $R_x$ and $R_y$ can be increased by primary values of greater than two. In the parallel-bank storage mode, write and read access operations can be effected using different addressing orders, expressed by different permutation constants for reading and writing. The permutation constants are prescribed externally or are produced internally on the memory chip.

Figure 6:
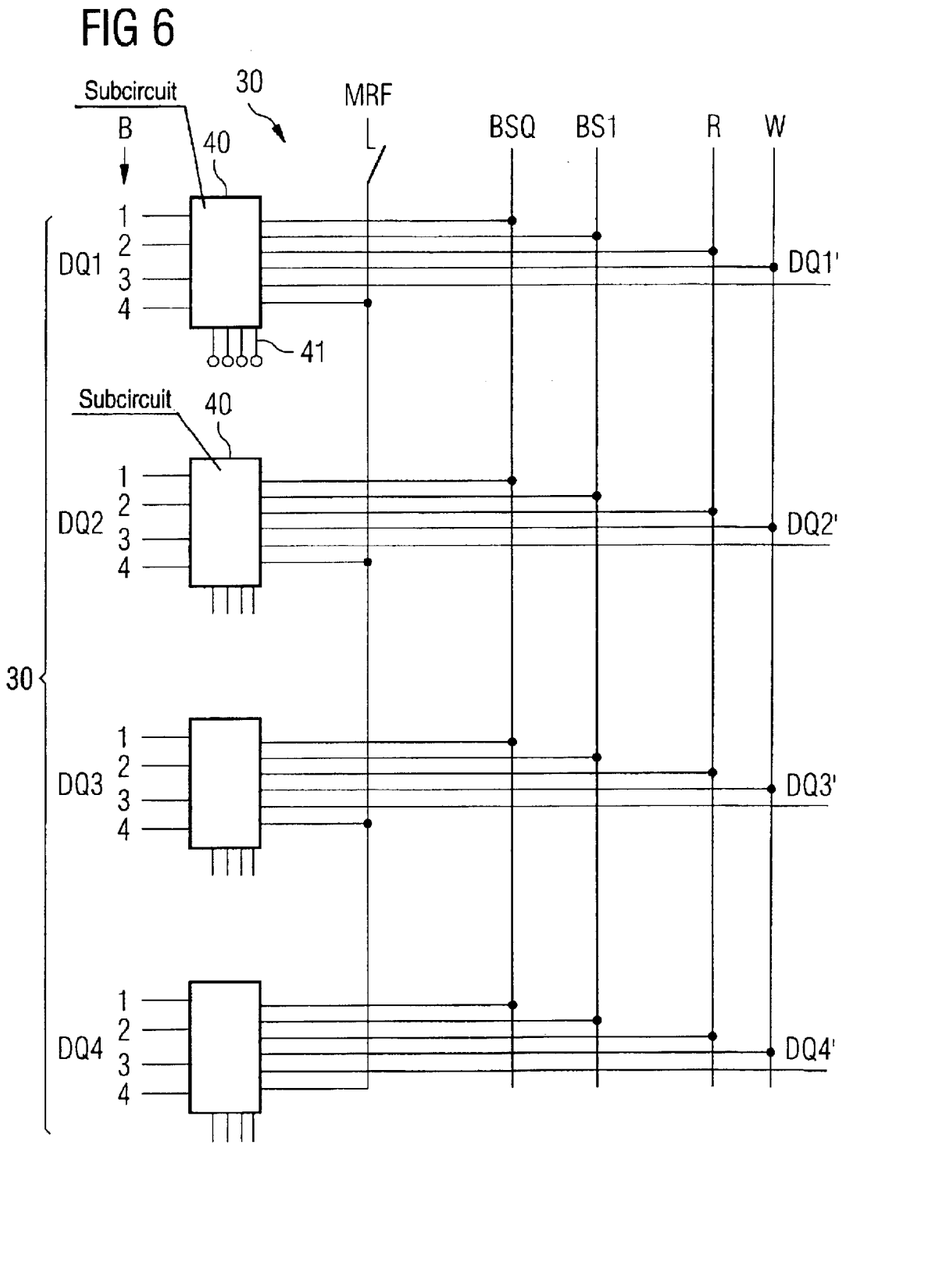
FIG. 6 is block diagram showing a circuit for creating error logs.

FIG. 6 shows a circuit 30 for the semiconductor memory 1 from FIG. 1, which is used to create an error log for a semiconductor chip having four data output lines, for example. It therefore has four subcircuits 40 which are connected to a respective data output line DQ1', DQ2', DQ3' and DQ4'. Data lines DQ1, DQ2, DQ3, and DQ4 are provided in quadruplicate for each of the four subcircuits, i.e. a total of sixteen times. They are routed from the subcircuits 40 to the memory banks denoted by 1 to 4. The quadruplicate configuration of subcircuits 40 and the 16-fold configuration of supply lines to the memory banks B comes from the bus width chosen as an example being 4 bits in the semiconductor memory shown in FIG. 6. The description of FIG. 6 is limited below to just the top subcircuit 40, which is connected to the data line DQ1', The subcircuit 40 is the central component of the error log circuit 30 and is used for calculating from the data lines 1, 2, 3, and 4 a data bit D which is output via the output line DQ1' instead of a data value DQ which is read from the memory addresses. By way of example, the data bit D can assume the value "1" if the data bits read from the data lines 1, 2, 3, and 4 are not identical. This indicates and forwards the occurrence of a storage error. The downwardly directed memory bank signal lines 41 are used for outputting information items which indicate which memory bank has stored an incorrect value.

The mode register for error log creation MRF can be used to activate and deactivate the error log circuit 30. The bank selection lines BS0 and BS1 can be used to take down the interconnections between the supply lines to all the memory banks and to address these memory banks individually again. Finally, the command "read" or "write" to be executed can be communicated by lines R and W, which correspond to the lines RD2 and WR2 in FIG. 2.

Using the error log circuit shown in FIG. 6, error logs containing a wide variety of log data can be created and output. Examples thereof are shown in FIGS. 7A and 7B.

Figure 7A:
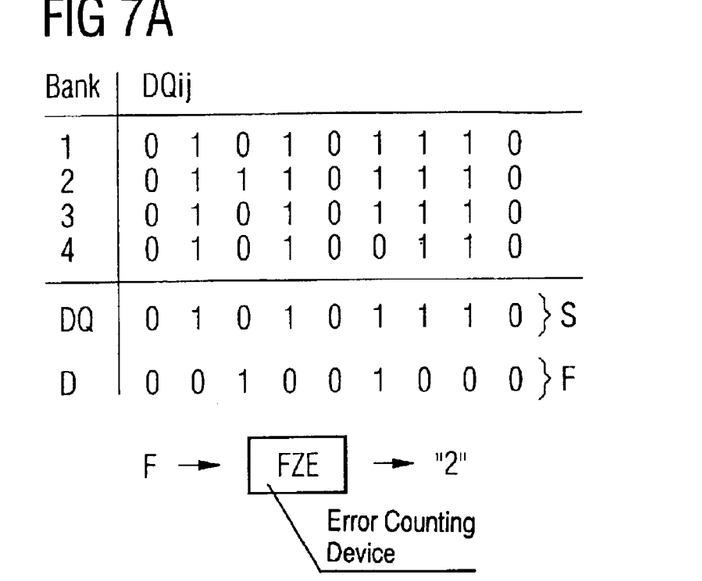
FIGS. 7A and 7B are tables showing various error logs.

FIG. 7A shows the data bits read from four memory banks 1, 2, 3, and 4 over a sequence of nine clock cycles. A bottom row indicates data values DQ that are calculated by the synchronization units 11 from the four respective data bits read and which indicate the respectively correct data value. The sequence of nine data bits DQ forms the data sequence S, which is output via a data line DQ'.

Alternatively, instead of the data DQ that are read, an information item D can be output, which indicates if a storage error has occurred, These data bits D assume the value 1 only by way of exception and together form a very compact error log F that is suitable for counting storage errors without indicating the memory addresses. If the error log F is supplied to an error counting device FZE, this device counts the total number of all errors which have occurred and, in the example illustrated, outputs the error sum "2" as the counting result.

Figure 7B:
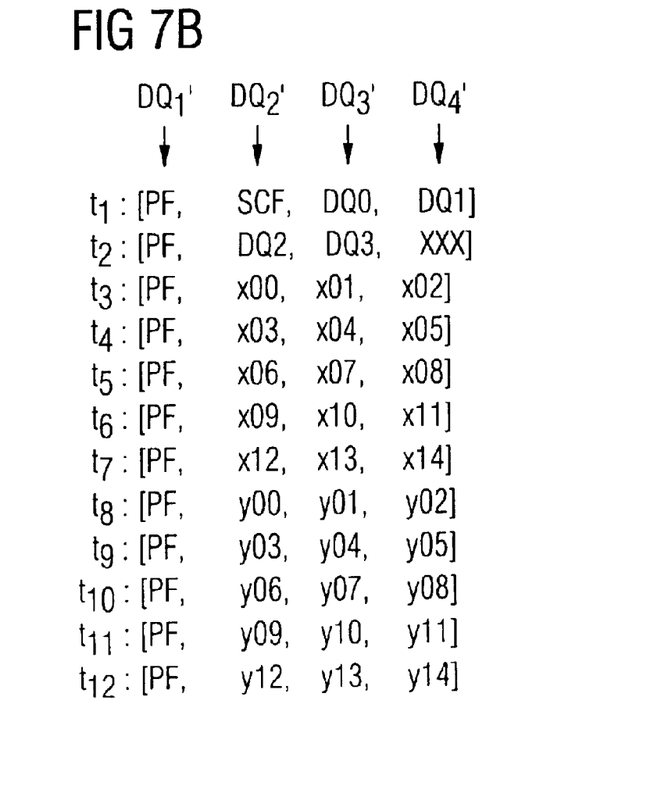

A more complex error log is shown in FIG. 7B. Over a sequence of twelve (12) clock cycles, square brackets indicate what is output as a data bit by the four bus lines DQ1', DQ2', DQ3'and DQ4' shown in FIG. 6. After every check on a group of memory addresses, at least twelve time cycles are connected in order to output as complete an error log as possible. In the first cycle t1, the data line DQ1' outputs a "1" if a storage error has been established, otherwise a "0" (PF; Pass-Fail). In the first time cycle, the data line DQ2' indicates which bit value "0" or "1" has been produced in one of the four memory cells read (SCF, Single Cell Fail), Further data bits DQ1, DQ2, DQ3, and DQ4 transmitted in the first two time cycles indicate that group of mutually associated memory cells on the four-line bus has an error. In this case, the rest of the time cycles t3 to t12 are used for transmitting the 15-bit row and column addresses, which are respectively in binary notation in the present case.

The form of the error log shown in FIG. 7B is merely exemplary. Depending on the purpose of the error log, a more compact or more complex form can also be chosen which requires fewer or more time cycles. The information items in the error log are dependent on the bus width of the data output lines and on the address space for the x and y addresses of the respective memory.

Using the error log circuit, test-mode operation of a semiconductor memory can involve log data of interest being calculated directly and being output instead of the data retrieved in the memory, The error log circuit 30 does not necessarily have to be a separate circuit from the checking unit 10, as shown in FIG. 1; it can also be partially linked to the checking unit 10, since the synchronization circuits 11, corresponding in number to the bit lines, undertake similar tasks to the subcircuits 40 provided a plurality of times in the error log circuit 30 on the basis of the bus width.

I claim:

1. A method for operating a semiconductor memory having at least three memory areas each including a plurality of memory addresses, which comprises:
    connecting the memory addresses from the at least three memory areas in parallel with one another to form a group of memory addresses having a respective memory address from each of the at least three memory areas;
    writing a given information item to all of said memory addresses in said group;
    reading the information items from each of said memory addresses in said group; and
    performing an error check on the information items by checking if the information items read from said memory addresses in said group are identical to one another.

2. The method according to claim 1, wherein the memory areas are memory banks.

3. The method according to claim 2, wherein the memory addresses from precisely four memory banks connected in parallel with one another.

4. The method according to claim 1, which further comprises, if the error check reveals that the information items at the memory addresses in the group are not identical to one another, calculating a most-commonly occurring data value in the memory addresses of the group, and correcting the memory addresses by writing the most-commonly occurring data value to all of the memory addresses in the group.

5. The method according to claim 4, wherein the correcting step is performed automatically upon reading the memory addresses in the block.

6. The method according to claim 4, wherein the correcting step is performed automatically upon refreshing the memory areas.

7. The method according to claim 1, which further comprises operating the semiconductor memory in a test mode by repeatedly writing information items to various groups of the memory addresses in a given order and reading from the various groups of the memory addresses successively in a different order.

8. The method according to claim 7, which further comprises permitting the given order for all the various groups of memory addresses to provide the different order for reading the various groups of memory addresses successively.

9. The method according to claim 8, which further comprises permuting differently by choosing a different permutation when reading information items than when writing information items.

10. The method according to claim 8, which further comprises permuting the given order for the group of memory addresses by permuting the row addresses and the column addresses independently of one another.

11. The method according to claim 8, which further comprises permuting the order for the various groups of memory addresses accessed successively by logically combining each of the memory addresses, digit by digit, with a permutation constant having as many binary digits as memory addresses in the given one of the memory areas, in binary notation by using an arithmetic operation to give a digit sequence indicating the permutated memory address, the arithmetic operation logically combining two bit values to give a logic value "1" at a precise point of differing bit values.

12. The method according to claim 7, which further comprises:
    permuting the various groups of the memory addresses among one another when writing and reading with permutation constants; and
    altering the information items to be stored and read again using the permutation constants.

13. The method according to claim 7, which further comprises:
    providing a circuit on the semiconductor memory; and
    permuting the given order of successively accessing various groups of memory addresses with the circuit on the semiconductor memory.

14. The method according to claim 1, which further comprises operating the semiconductor memory in a test mode by reading the information items while creating an error log based on the error check being output instead of the information items being read.

15. The method according to claim 14, wherein the reading of information items from a group of the memory addresses involves outputting a data value to indicate when the information items being read are identical to one another.

16. The method according to claim 15, which further comprises:
outputting just the data value with no indication of the memory addresses; and
using the data value for error counting.

17. The method according to claim 15, which further comprises:
organizing the memory addresses of respective memory areas into a plurality of groups;
providing a databus having a respective data line connected to each of the groups;
simultaneously accessing the information items in the plurality of groups of memory addresses with the data bus; and
outputting the data value from each group of memory addresses that each data line in the data bus is accessing.

18. The method according to claim 17, which further comprises:
creating an error log when the information items have been read and the data lines successively output over a plurality of time cycles; and
storing error log details in the error log about error occurrences, types of errors, numbers of data lines outputting an error, and the memory addresses that have been read from.

19. A semiconductor memory, comprising:
at least three memory areas each having a multiplicity of memory addresses for storing information items;
synchronization circuits for connecting memory addresses from said at least three memory areas in parallel with one another to form a group and to allow each read and write operation to access said group of memory addresses and for routing a given information item to all of said memory addresses in said group during a write operation; and
a checking unit for checking if said information items at said memory addresses in said group are identical to one another.

20. The semiconductor memory according to claim 19, wherein said synchronization circuits are integrated in said checking unit.

21. The semiconductor memory according to claim 19, wherein each of said synchronization circuits is connected to a respective one of said memory addresses from each of said memory areas.

22. The semiconductor memory according to claim 19, wherein said memory areas are memory banks.

23. The semiconductor memory according to claim 19, wherein each of said synchronization circuits has a correction circuit routing a standard data value to all the memory addresses connected to said respective synchronization circuit following at least of reading and refreshing of the information items.

24. The semiconductor memory according to claim 23, wherein:
said synchronization circuits and said correction circuits are activated in a first operating mode;
just said synchronization circuits are activated in a second operating mode; and
said synchronization circuits and said correction circuits are deactivated in a third operating mode;
only one of said operating modes being selectable at a given time.

25. The semiconductor memory according to claim 19, further comprising a circuit interchanging memory addresses within one of said memory areas and redirecting commands to the interchanged memory addresses.

26. The semiconductor memory according to claim 19, further comprising a circuit for outputting an error log, said circuit outputting data values indicating if the information items read in said group of said memory addresses are identical to one another.

27. The semiconductor memory according to claim 26, wherein said circuit outputs said error log instead of the information items read from said memory addresses.

28. The semiconductor memory according to claim 26, wherein said circuit outputs said error log in addition to the information items read from said memory addresses.

29. The semiconductor memory according to claim 26, wherein:
said memory addresses individually output just the information items read from the individual memory addresses in said group while in a first operating mode;
said memory addresses individually output just the data values, instead of the information items, and indicate if the information items are identical to one another, while in a second operating mode; and
said memory addresses individually output the data values and additionally the information items being read, while in a third operating mode;
only one of said operating modes being selectable at a time.

* * * * *